US012293928B2

(12) United States Patent
Lim et al.

(10) Patent No.: US 12,293,928 B2
(45) Date of Patent: May 6, 2025

(54) APPARATUS AND METHOD FOR TREATING SUBSTRATE (71) Applicant: SEMES CO., LTD., Cheonan-si (KR)

(72) Inventors: Eui Sang Lim, Cheonan-si (KR); Yong Hee Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 400 days.

(21) Appl. No.: 17/563,189

(22) Filed: Dec. 28, 2021

(65) Prior Publication Data

US 2022/0208564 A1 Jun. 30, 2022

(30) Foreign Application Priority Data

Dec. 28, 2020 (KR) .................. 10-2020-0184414

(51) Int. Cl.
*H01L 21/67* (2006.01)
*H01L 21/02* (2006.01)
*H01L 21/677* (2006.01)

(52) U.S. Cl.
CPC .. *H01L 21/67023* (2013.01); *H01L 21/02101* (2013.01); *H01L 21/67034* (2013.01); *H01L 21/67109* (2013.01); *H01L 21/67742* (2013.01)

(58) Field of Classification Search
CPC .... F26B 23/04; H01L 21/02101; H01L 21/67; H01L 21/67051
See application file for complete search history.

(56) References Cited

U.S. PATENT DOCUMENTS

| 7,621,969 | B2* | 11/2009 | Masumoto | H01L 24/81 438/106 |
| 2011/0000507 | A1* | 1/2011 | Toshima | H01L 21/02101 134/61 |
| 2013/0284209 | A1* | 10/2013 | Kim | H01L 21/67028 134/61 |
| 2021/0104417 | A1* | 4/2021 | Lim | H01J 37/32834 |

FOREIGN PATENT DOCUMENTS

| JP | 2011-021843 | 2/2011 |
| KR | 10-2009-0037931 | 4/2009 |
| KR | 101817211 | 12/2017 |
| KR | 1020190002112 | 1/2019 |

OTHER PUBLICATIONS

Office Action from the Korean Intellectual Property Office dated Feb. 13, 2023.

* cited by examiner

*Primary Examiner* — Tinsae B Ayalew (57) ABSTRACT

A substrate treating device includes a liquid treating chamber for liquid-treating a substrate therein, a drying chamber for dry-treating the liquid-treated substrate, a transfer device for transferring the substrate between the liquid treating chamber and the drying chamber, and a controller for controlling the liquid treating chamber and the transfer device. The transfer device includes a transfer robot having a hand for placing the substrate thereon, and a heating member for heating the substrate. The controller controls the transfer device such that the heating member of the transfer device heats a liquid on the substrate to a first temperature before the transfer device transfers the substrate taken out from the liquid treating chamber to the drying chamber.

4 Claims, 8 Drawing Sheets

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2020-0184414 filed on Dec. 28, 2020, in the Korean Intellectual Property Office, the entire contents of which are hereby incorporated by reference.

BACKGROUND

Embodiments of the inventive concept described herein relate to a fluid supply unit and substrate treating apparatus, more specifically, a fluid supply unit supplying a supercritical fluid and substrate treating apparatus having the same.

Generally, semiconductor devices are manufactured from substrates such as wafers. Specifically, the semiconductor devices are manufactured by forming fine circuit patterns on an upper surface of a substrate by performing processes such as deposition, photolithography, cleaning, drying, and etching etc. Since various foreign substances are attached to a top surface of the substrate on which a circuit pattern is formed while performing the above processes, a cleaning process of removing foreign substances on the substrate is performed between the processes.

Generally, the cleaning process includes a chemical treatment to remove foreign substances from a substrate by supplying a chemical to the substrate, a rinsing treatment to remove remaining chemicals from the substrate by supplying pure water to it, and a drying treatment to remove a remaining pure water from the substrate.

A supercritical fluid is used to dry substrates. For example, the pure water on the substrate is replaced with an organic solvent, and the supercritical fluid is supplied to the top surface of the substrate in a high-pressure chamber to dissolve and remove the organic solvent remaining on the substrate. If isopropyl alcohol (IPA) is used as the organic solvent, a carbon dioxide ($CO_2$) is used as the supercritical fluid because it has a relatively low critical temperature and critical pressure and dissolves the IPA well.

The treating of substrates using the supercritical fluid is as follows. When the substrate is brought into the high-pressure chamber, the supercritical carbon dioxide is supplied into the high-pressure chamber to pressurize the inside of the high-pressure chamber, and then the substrate is treated with the supercritical fluid while repeatedly supplying the supercritical fluid and exhausting the high-pressure chamber. After treating the substrate, the high-pressure chamber is exhausted and is decompressed.

It is required to use the IPA at a high temperature to increase the reactivity between the carbon dioxide and the IPA. However, if the temperature of the IPA is provided high when the IPA is supplied onto the substrate, there is a problem that the IPA may evaporate during supplying and leave a stain on the substrate.

SUMMARY

The purpose of the inventive concept is to provide a substrate treating apparatus and a substrate treating method capable of easily replacing an atmosphere in a processing chamber in which a substrate is treated using a supercritical fluid when treating a substrate using the supercritical fluid.

The purpose of the inventive concept is not limited thereto, and other objectives not mentioned will be clearly understood by those skilled in the art from the following statements.

Embodiments of the inventive concept provide a substrate treating apparatus. In an embodiment, the apparatus comprises: a liquid treating chamber for liquid-treating a substrate therein; a drying chamber for dry-treating the liquid-treated substrate; a transfer device for transferring the substrate between the liquid treating chamber and the drying chamber; and a controller for controlling the liquid treating chamber and the transfer device, wherein the transfer device comprises: a transfer robot having a hand for placing the substrate thereon; and a heating member for heating the substrate, and wherein the controller controls the transfer device such that the heating member of the transfer device heats a liquid on the substrate to a first temperature before the transfer device transfers the substrate taken out from the liquid treating chamber to the drying chamber.

In an embodiment, the heating member is a heater provided at the hand.

In an embodiment, the heating member is provided as a heating chamber between the liquid treating chamber and the drying chamber, and the heating chamber comprises: a housing with an opening allowing an entry/exit of the hand; a support unit for placing the substrate thereon; and a gas supply device for supplying a high temperature gas to an inner space of the housing.

In an embodiment, the heating member is provided as a heating plate provided having a heater therein and disposed between the liquid treating chamber and the drying chamber.

In an embodiment, the controller controls the liquid treating chamber as to supply the liquid at a second temperature to the substrate within the liquid treating chamber, and controls the transfer device for t the heating member to heat the liquid on the substrate to the first temperature, the first temperature being higher temperature than the second temperature.

In an embodiment, the second temperature is higher temperature than a room temperature.

In an embodiment, the liquid is an organic solvent, and a supercritical fluid is supplied to an inside of the drying chamber.

In an embodiment, the first temperature is lower than a boiling point of the liquid.

Embodiments of the inventive concept provide a substrate treating method. In an embodiment, the method comprises: transferring a substrate which has been liquid treated in a liquid treating chamber by supplying a liquid onto the substrate from the liquid treating chamber to a drying chamber; and dry treating the liquid treated substrate by supplying a fluid into the drying chamber, wherein the liquid on the substrate is heated to a first temperature before the dry treating the liquid treated substrate.

In an embodiment, the liquid on the substrate is heated to the first temperature before the substrate is taken into the drying chamber.

In an embodiment, the liquid on the substrate is heated to the first temperature during the time period after the substrate is being substantially taken out of the liquid treating chamber and before being substantially taken into the drying chamber.

In an embodiment, the liquid on the substrate is heated to the first temperature on a transfer device which transfers the substrate between the liquid treating chamber and the drying chamber.

In an embodiment, the liquid on the substrate is heated to the first temperature within a heating chamber provided between the liquid treating chamber and the drying chamber.

In an embodiment, the liquid within the liquid treating chamber is supplied at a second temperature, the liquid on the substrate is heated to the first temperature during the time period after the substrate is being substantially taken out of the liquid treating chamber and before being substantially taken into the drying chamber, and the first temperature higher temperature than the second temperature.

In an embodiment, the second temperature is higher than a room temperature.

In an embodiment, the first temperature is lower than a boiling point of the liquid.

In an embodiment, the liquid is an organic solvent and the fluid is provided as a supercritical fluid.

Embodiments of the inventive concept provide a substrate treating method. In an embodiment, the method comprises: liquid treating a substrate by supplying an organic solvent onto the substrate inside a liquid treating chamber; after the liquid treating a substrate, transferring the substrate to a drying chamber, and dry treating the substrate by supplying a supercritical fluid to an inside of the drying chamber, and wherein before the substrate is taken into the drying chamber, the organic solvent on the substrate is heated to below a boiling point of the organic solvent.

In an embodiment, the liquid on the substrate is heated to the first temperature on a transfer device which transfers the substrate between the liquid treating chamber and the drying chamber.

In an embodiment, the liquid on the substrate is heated to the first temperature within a heating chamber provided between the liquid treating chamber and the drying chamber.

According to an embodiment of the inventive concept, the adhesive layer attached to the processing chamber can be easily removed.

In addition, according to an embodiment of the inventive concept, it is possible to prevent waste from being dispersed when removing the adhesive layer attached to the processing chamber.

The effects of the inventive concept are not limited to the above-described effects, and the effects not mentioned may be clearly understood by those of ordinary skill in the technical field to which the inventive concept belongs from this specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Figure 1:
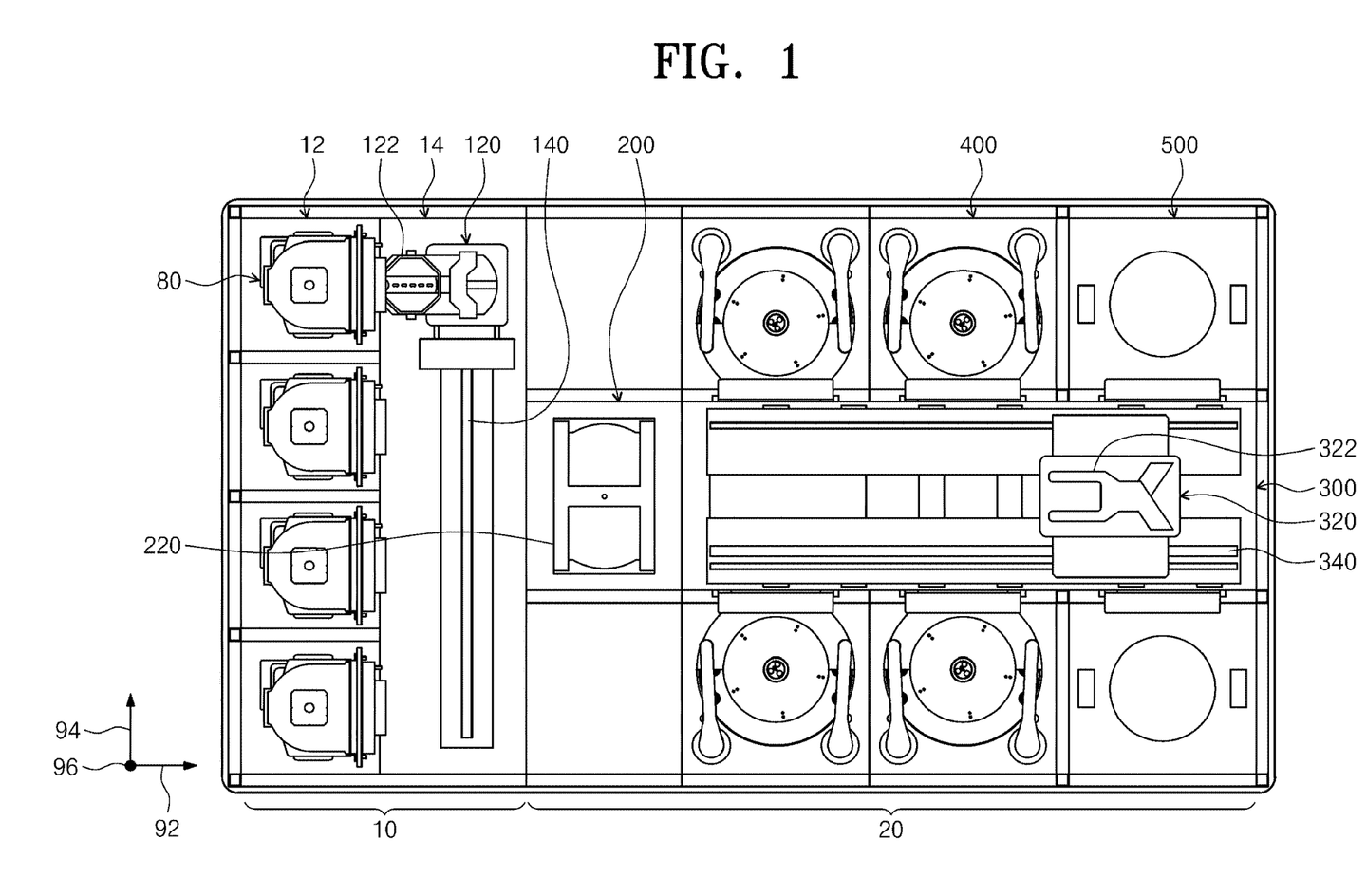
FIG. 1 is a top-plan view schematically illustrating a substrate treatment apparatus according to an embodiment of the inventive concept.

FIG. 1 illustrates a substrate treatment apparatus according to an embodiment of the inventive concept. Referring to FIG. 1, the substrate treatment apparatus comprises an index module 10, a treating module 20, and a controller (not shown). According to an embodiment, the index module 10 and the treating module 20 are sequentially arranged. Hereinafter, a direction in which the index module 10 and the treating module 20 are arranged will be referred to as a first direction 92. A direction that is perpendicular to the first direction 92 when viewed from above will be referred to as a second direction, and a direction that is perpendicular to both the first direction 92 and the second direction 94 will be referred to as a third direction 96.

The index module 10 returns the substrate W from the container 80 where the substrate W is stored to the treating module 20, and gets the processed substrate W from the treating module 20 to be stored in the container 80. The index module 10 is disposed with its length extending along the second direction 94. The index module 10 has a load port 12 and an index frame 14. The index frame 14 is disposed between the load port 12 and the treating module 20. The container 80 in which the substrates W are stored is placed on the load port 12. A plurality of load ports 12 may be provided, and the plurality of load ports 12 may be disposed along the second direction 94.

For the container 80, a closing-type container such as the Front Open Unified Pod (FOUP) can be used. The container 80 can be placed on the load port 12 by an overhead transfer, an overhead conveyor, an automatic guided vehicle, or by an operator.

The index frame 14 is provided with an index robot 120. In the index frame 14, a guide rail 140 is provided with its length extending along the second direction 94, and the index robot 120 may be provided movable on the guide rail 140. The index robot 120 includes a hand 122 on which the substrate W is placed, and the hand 122 can be provided forwardly and backwardly movable, rotatable with the third direction 96 as an axis, and movable along the third direction 96. A plurality of hands 122 are provided vertically placed apart, and the hands 122 can be forwardly and backwardly movable independent of each other.

The treating module 20 includes a buffer unit 200, a transfer device 300, a liquid treating chamber 400, and a drying chamber 500. The buffer unit 200 provides a temporary space for the substrate W being brought into the treating module 20 and the substrate W being taken from the treating module 20. The liquid treating chamber 400 supplies liquid to the substrate W to perform a liquid treatment process on the substrate W. The drying chamber 500 performs a drying process to remove the liquid remaining on the substrate W. The transfer device 300 transfers the substrate W between the buffer unit 200, the liquid treating chamber 400, and the drying chamber 500.

The transfer device 300 may be arranged with its length extending along the first direction 92. The buffer unit 200 can be placed between the index module 10 and the transfer device 300. The liquid treating chamber 400 and drying chamber 500 may be disposed on a side of the transfer device 300. The liquid treating chamber 400 and the transfer device 300 may be disposed along the second direction 94. The drying chamber 500 and the transfer device 300 may be disposed along the second direction 94. The buffer unit 200 may be located at one end of the transfer device 300.

In an embodiment, the liquid treating chambers 400 may be disposed on both sides of the transfer device 300, the drying chambers 500 may be disposed on both sides of the transfer device 300, and the liquid treating chambers 400 may be disposed closer to the buffer unit 200 than the drying chambers 500. On one side of the transfer device 300, liquid treating chambers 400 may be provided in an array of A×B (A, B are natural numbers greater than 1 or 1 respectively) along the first direction 92 and third direction 96 respectively. In addition, on one side of the transfer device 300, drying chambers 500 may be provided in an array of C×D (C, D are natural numbers greater than 1 or 1 respectively) along the first direction 92 and the third direction 96 respectively. Unlike the aforementioned, only liquid treating chambers 400 may be provided on one side of the transfer device 300 and only drying chambers 500 may be provided on the other side.

The transfer device 300 has a transfer robot 320 and a heating device. Within the transfer device 300, a guide rail 340 is provided with its length extending along the first direction 92 and the transfer robot 320 may be provided movable on the guide rail 340. The transfer robot 320 includes a hand 322 on which the substrate W is placed, and the hand 322 may be provided forwardly and backwardly movable, rotatable with the third direction 96 as an axis, and movable along the third direction 96. A plurality of hands 122 are provided vertically placed apart, and the hands 122 can be forwardly and backwardly movable independent of each other. The heating device heats the liquid treated substrate at the liquid treating chamber 400. The heating device will be described later.

The buffer unit 200 has a plurality of buffers 220 on which the substrates W are placed. The buffers 220 may be provided placed apart from each other along the third direction 96. The buffer unit 200 has an open front side and an open rear side. The front side faces the index module 10, and the rear side faces the transfer device 300. The index robot 120 can access the buffer unit 200 through the front side and the transfer robot 320 can access the buffer unit 200 through the rear side.

Figure 2:
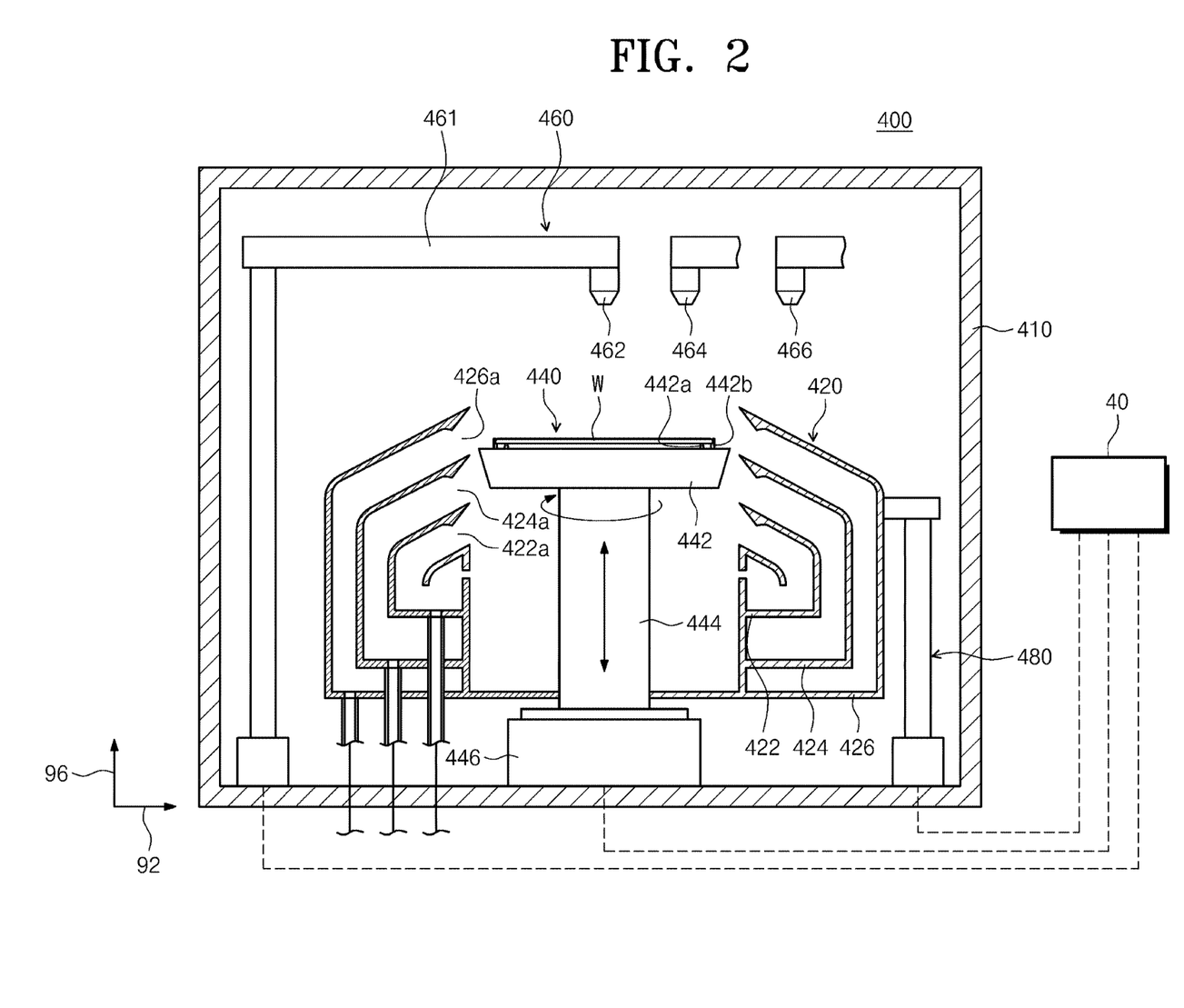
FIG. 2 is a view schematically illustrating a liquid treating device of FIG. 1.

FIG. 2 illustrates an embodiment of the liquid treating chamber 400 in FIG. 1. Referring to FIG. 2, the liquid treating chamber 400 has a housing 410, a cup 420, a support member 440, a liquid supply unit 460, a lifting/lowering unit 480, and a controller 40. The controller 40 controls the operation of the liquid supply unit 460, the support member 440, and the lifting/lowering unit 480. The housing 410 is generally provided in a rectangular parallelepiped shape. The cup 420, the support member 440, and the liquid supply unit 460 are located in the housing 410.

The cup 420 has a treating space with an open upper portion, and the substrate W is liquid processed within the treating space. The support member 440 supports the substrate W within the treating space. The liquid supply unit 460 supplies the liquid onto the substrate W supported by the support member 440. Liquid can be provided in multiple types, and supplied sequentially onto the substrate W. The lifting/lowering unit 480 adjusts the relative level between the cup 420 and the support member 440.

In an embodiment, the cup 420 has a plurality of collecting bowls 422, 424, and 426. Each of the collecting bowls 422, 424, and 426 has a collecting space to collect the liquid used to process the substrate. Each collecting bowl of the collecting bowls 422, 424, and 426 is provided in a ring shape surrounding the support member 440. When the liquid treatment process is carried out, the treatment liquid scattered due to the rotation of the substrate W flows into the collecting space through the inlets 422a, 424a, and 426a of each collecting bowl of the collecting bowls 422, 424, and 426. In an embodiment, the cup 420 has a first collecting bowl 422, a second collecting bowl 424, and a third collecting bowl 426. The first collecting bowl 422 is disposed to surround the support member 440, the second collecting bowl 424 is disposed to surround the first collecting bowl 422, and the third collecting bowl 426 is disposed to surround the second collecting bowl 424. The second inlet 424a that flows liquid into the second collecting bowl 424 may be located above the first inlet 422a that flows liquid into the first collecting bowl 422, and the third inlet 426a that flows liquid into the third collecting bowl 426 may be located above the second inlet 424a.

The support member 440 has a support plate 442 and a drive shaft 444. The upper surface of the support plate 442 is generally provided in a disc shape and may have a diameter greater than the substrate W. At the center of the support plate 442, a support pin 442a is provided to support the bottom surface of the substrate W, and an upper end of the support pin 442a is provided to protrude from the support plate 442 so that the substrate W is placed apart from the support plate 442. A chuck pin 442b is provided at the edge of the support plate 442.

The chuck pin 442b is provided to protrude upwards from the support plate 442, supporting(abutting) the side of the substrate W so that when the substrate W is rotated, the substrate W does not deviate from the support member 440. The drive shaft 444 is driven by a driving member 446 and is connected to the center of the bottom surface of the substrate W and rotates the support plate 442 relative to its center axis.

In an embodiment, the liquid supply unit 460 has a first nozzle 462, a second nozzle 464, and a third nozzle 466. The first nozzle 462 supplies a first liquid onto the substrate W. The first liquid may be the liquid that removes a layer or foreign substances remaining on the substrate W. The second nozzle 464 supplies a second liquid onto the substrate W. The second liquid may dissolve well in a third liquid. For example, the second liquid may dissolve better in the third liquid than in the first liquid. The second liquid may neutralize the first liquid supplied on the substrate W. In addition, the second liquid may neutralize the first liquid and at the same time dissolve better in the third liquid compared to the first liquid.

In an embodiment, the second liquid can be water. The third nozzle 466 supplies the third liquid onto the substrate W. The third liquid may dissolve well in the supercritical fluid used in the drying chamber 500. For example, the third liquid may dissolve better in the supercritical fluid used in the drying chamber 500 compared to the second liquid. In an embodiment, the third liquid can be an organic solvent. The organic solvent may be isopropyl alcohol (IPA). In an embodiment, the supercritical fluid can be carbon dioxide.

The first nozzle 462, the second nozzle 464, and the third nozzle 466 are supported by a different arm 461 and these arms 461 can be moved independently. Optionally, the first nozzle 462, the second nozzle 464, and the third nozzle 466 may be installed on the same arm and move simultaneously.

The lifting/lowering unit 480 moves the cup 420 in an up/down direction. The relative level between the cup 420 and the substrate W is changed by the vertical movement of the cup 420. As a result, the collecting bowls 422, 424, and 426 that collect the treatment liquid changes depending on the type of liquid supplied to the substrate W, so the liquids can be separately collected. Unlike the aforementioned, the cup 420 is fixedly installed and the lifting/lowering unit 480 can vertically move the support member 440.

Figure 3:
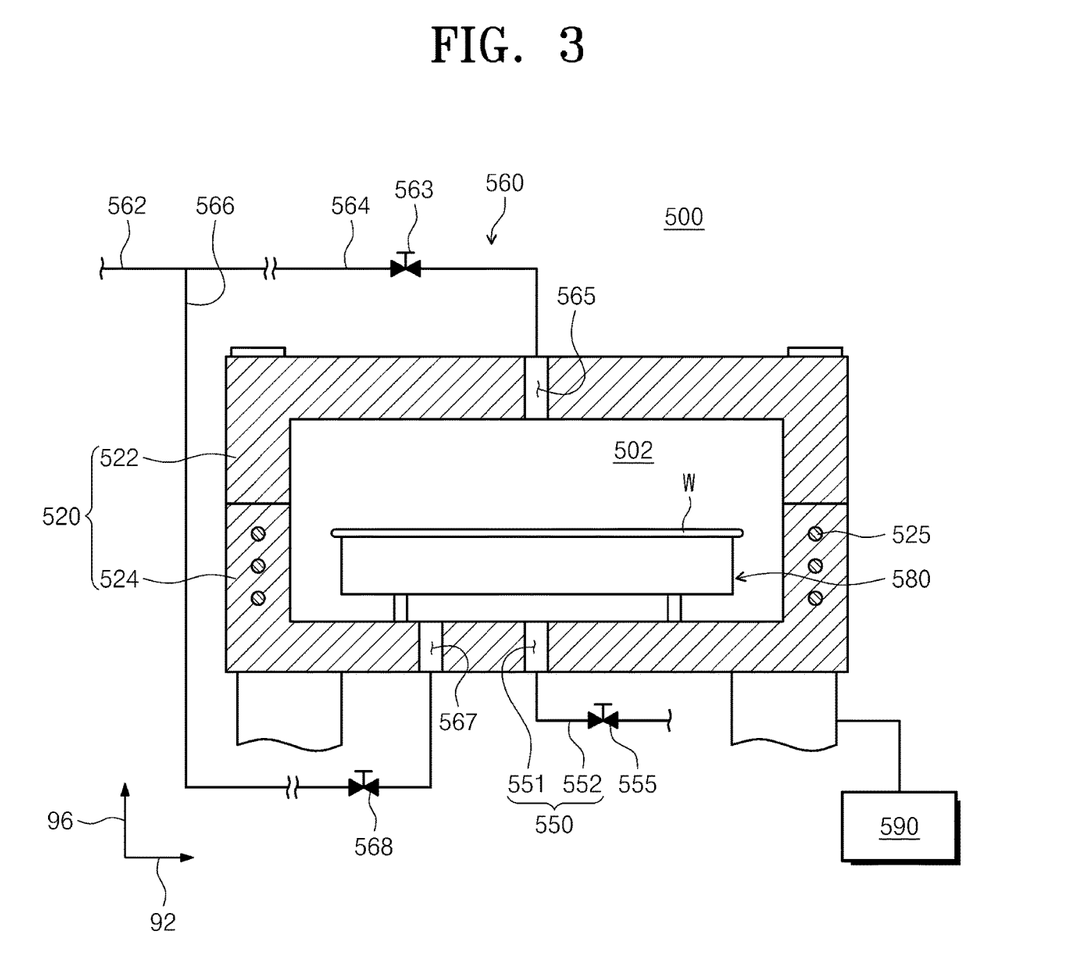
FIG. 3 is a view schematically illustrating an embodiment of a supercritical device of FIG. 1.

FIG. 3 illustrates an embodiment of the drying chamber 500 in FIG. 1. According to an embodiment, the drying chamber 500 removes the liquid from the substrate W using the supercritical fluid. According to one embodiment, the liquid on the substrate W is isopropyl alcohol (IPA). The drying chamber 500 supplies supercritical fluid onto the substrate and dissolves the IPA on the substrate W in the supercritical fluid to remove the IPA from the substrate W.

Referring to FIG. 3, the drying chamber 500 includes a processing chamber 520, a liquid supply unit 560, an exhaust unit 550. The processing chamber 520 provides a treating space 502 in which the cleaning process of cleaning the substrate is performed. The processing chamber 520 has a first body 522 and a second body 524. The first body 522 and the second body 524 combine to provide the treating space 502. In an embodiment, the first body 522 is provided above the second body 524. In an embodiment, the processing chamber 520 moves between an opening position and a closing position. The opening position is a position where the first body 522 and the second body 524 are spaced apart, and the closed position is a position where at least one of the first body 522 or the second body 524 is moved toward and adhere each other to seal the treating space 502 502. In an embodiment, the position of the first body 522 may be fixed, and the second body 524 may be lifted or lowered by a driving member 590 such as a cylinder. In one embodiment, when the second body 524 is spaced apart from the first body 522, the treating space 502 is opened, and at this time, the substrate W is taken in or taken out. Selectively, the position of the second body 524 may be fixed, and the first body 522 may be lifted or lowered by a driving member 590 such as a cylinder.

During the cleaning process of cleaning the substrate W inside the treating space 502, the second body 524 is in close contact with the first body 522, so that the treating space 502 is sealed from the outside. A heater 525 is provided within the wall of the processing chamber 520. The heater 525 heats the treating space 502 of the processing chamber 520 so that the fluid supplied into the inner space of the processing chamber 520 remains supercritical. Inside the treating space 502 an atmosphere is formed by the supercritical fluid.

The support unit 580 supports the substrate W within the treating space 502 of the processing chamber 520. The substrate W brought into the treating space 502 of the processing chamber 520 is placed on the support unit 580. In an embodiment, the substrate W is supported by the support unit 580 with the pattern surface of the substrate W facing upwards.

The liquid supply unit 560 supplies a cleaning fluid for a substrate treatment to the treating space 502 of the processing chamber 520. According to an embodiment, the fluid supply unit 560 has a main supply line 562, a top supply line 564, and a bottom supply line 566. The main supply line 562 is connected to a fluid supply source (not shown) to supply the supercritical fluid to the treating space 502. The top supply line 564 and the bottom supply line 566 branch from the main supply line 562. The top supply line 564 is connected to a top supply pipe 565. The bottom supply line 566 is connected to a bottom supply pipe 567. In an embodiment, the top supply pipe 565 is formed at a center of the first body 522, and the bottom supply pipe 567 is formed at eccentric position from a center of the second body 524. Accordingly, the top supply line 564 may be coupled to the center of the first body 522, and the bottom supply line 566 may be coupled to the eccentric position from the center of the second body 524. A top supply valve 563 is installed at the top supply line 564. The top supply valve 563 controls whether or not the supercritical fluid supplied to the treating space 502 through the top supply line 564 is supplied and a supply flow rate. A bottom supply valve 568 is installed at the bottom supply line 566. The bottom supply valve 568 controls whether or not the supercritical fluid supplied to the treating space 502 through the bottom supply line 566 is supplied and the supply flow rate.

The exhaust unit 550 includes an exhaust pipe 551 and an exhaust line 552. In an embodiment, the exhaust line 552 is coupled to the second body 524. The exhaust line 552 is connected to the exhaust pipe 551. In an embodiment, the exhaust pipe 551 may be formed at the center of the second body 524. The supercritical fluid in the treating space 502 of the processing chamber 520 is exhausted to the outside of the processing chamber 520 through the exhaust line 552. An exhaust valve 555 is installed at the exhaust line 552. The exhaust valve 555 controls whether the exhaust line 552 is exhausted.

Hereinafter, a heating member provided to the transfer device 300 of FIG. 1 will be described with reference to FIG. 4 to FIG. 6.

Figure 4:
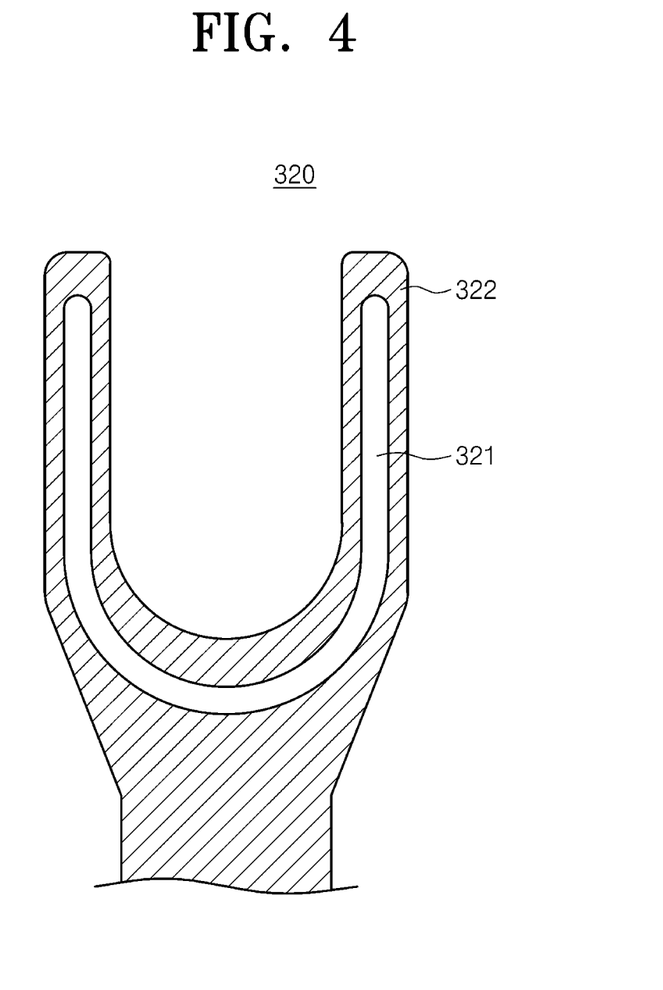
FIG. 4 is a view schematically illustrating an embodiment of hand of FIG. 1.
Figure 5:
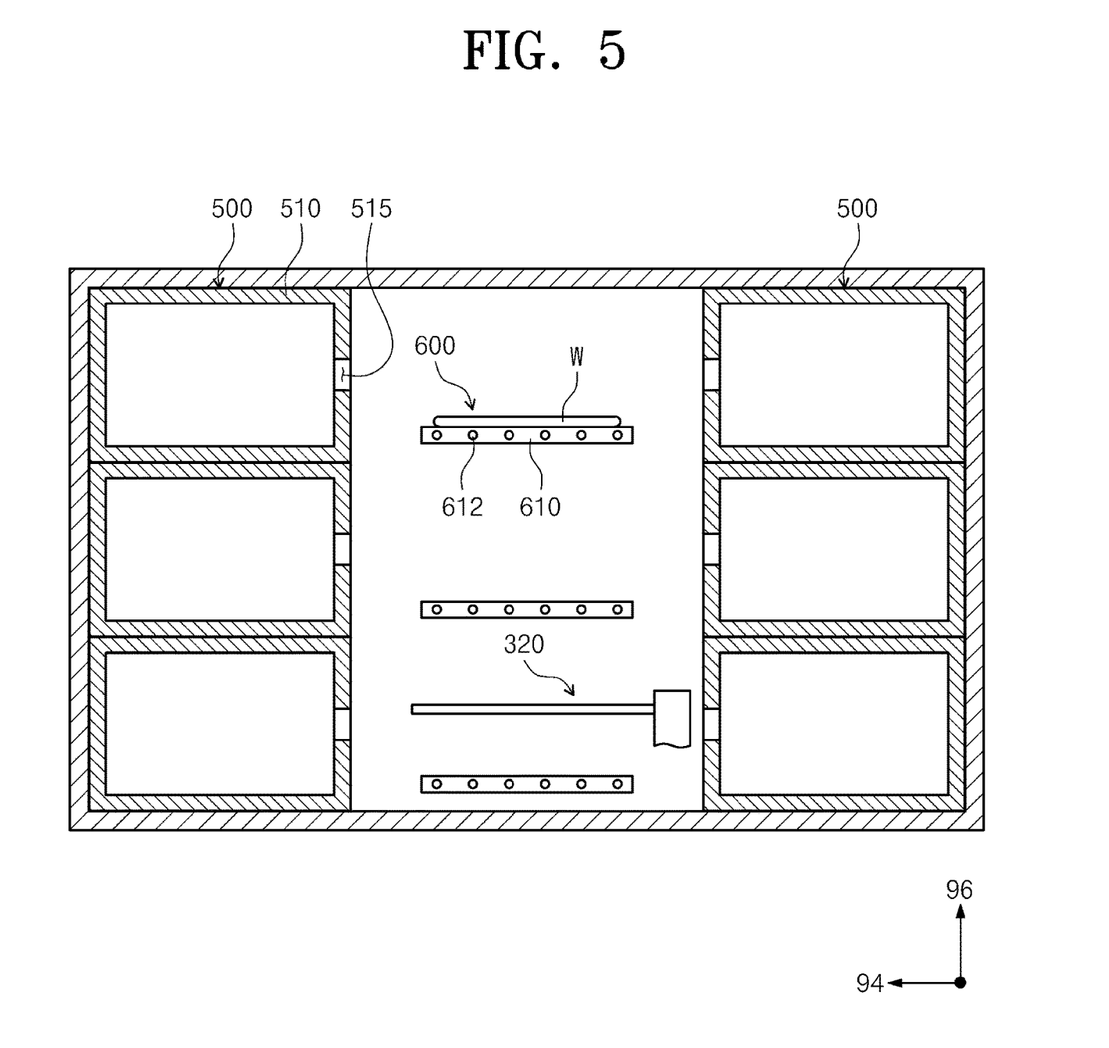
FIG. 5 is a view schematically illustrating a heating plate according to an embodiment of the inventive concept.
Figure 6:
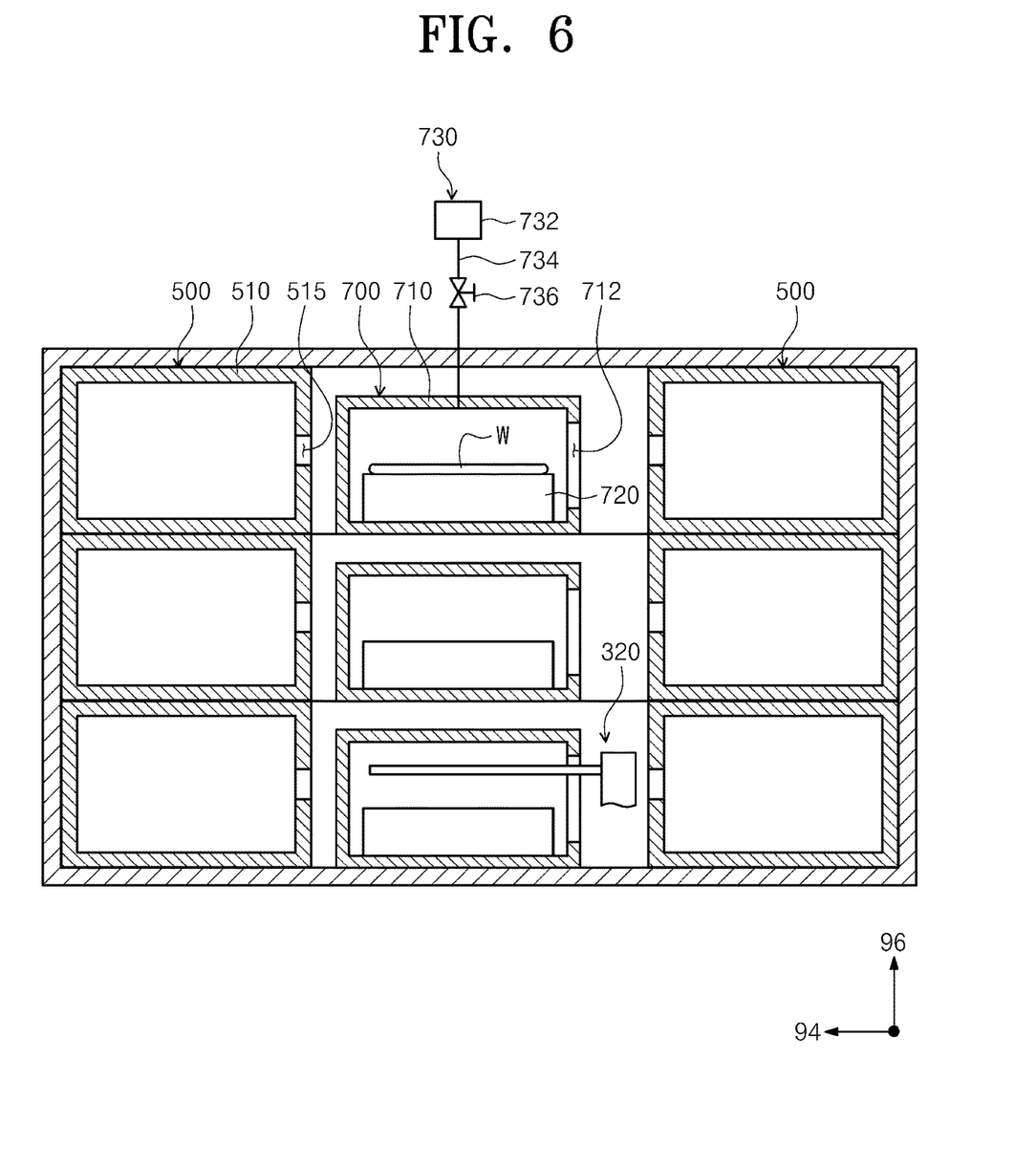
FIG. 6 is a view schematically illustrating a heating chamber according to an embodiment of the inventive concept.

FIG. 4 is a view schematically illustrating an embodiment of the hand 322 of FIG. 1, FIG. 5 is a view illustrating a heating plate 610 according to an embodiment of the inventive concept, and FIG. 6 is a view illustrating a heating chamber 700 according to an embodiment of the inventive concept.

In an embodiment, the heating member is provided in the hand 322 as shown in FIG. 4. For example, the heating member may be a heater 321 provided within the hand 322.

In an embodiment, the heating member 600 is provided as a heating plate 610 having a heater 612 therein as shown in FIG. 5. The heating plate 610 is provided with a mounting surface on which the substrate W may be placed. In an embodiment, the heating plate 610 may be provided between the liquid treating chamber 400 and the drying chamber 500. In an embodiment, the heating plate 610 may be located on a path through which the transfer device transfers the substrate W from the liquid treating chamber 400 to the drying chamber 500. For example, the heating plate 610 may be located between the drying chambers 500 based on the second direction. The substrate W is transferred between the heating plate 610 and the drying chamber 500 through an opening 515 formed in the housing 510 of the drying chamber 500 by the transfer robot 320.

In an embodiment, the heating member may be provided in the form of a heating chamber 700 as shown in FIG. 6. In an embodiment, the heating chamber 700 may be provided between the liquid treating chamber 400 and the drying chamber 500, or between the drying chambers 500, like the heating plate 610. In an embodiment, the heating chamber 700 may be located on a path through which the transfer device transfers the substrate W from the liquid treating chamber 400 to the drying chamber 500. For example, the heating chamber 700 may be located between the drying chambers 500 based on the second direction.

The heating chamber 700 has a housing 710, a support unit 720, and a gas supply device 730. The housing 710 has an inner space. An opening 712 through which the hand 322 may enter and exit is formed in the housing 710. The hand 322 takes the substrate W out of the heating chamber 700 through the opening 712. A support unit 720 is provided within the housing 710. The support unit 720 is provided with a mounting surface on which the substrate W is placed. The gas supply device 730 supplies a high-temperature gas to the inner space of the housing 710. The gas supply device 730 has a gas supply source 732, a gas supply line 734, and a supply valve 736. In an embodiment, the gas may be provided as air. The high-temperature gas is stored in the gas supply source 732. The gas is supplied into the housing 710 through the gas supply line 734. The supply valve 736 controls whether the gas supplied into the housing 710 is supplied and the supply flow rate.

Figure 7:
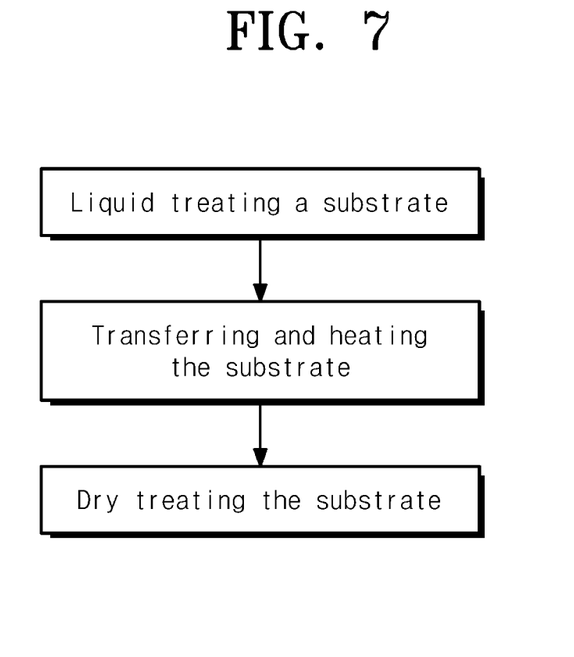
FIG. 7 to FIG. 10 are each views illustrating a flow chart of a substrate treating method according to an embodiment of the inventive concept.

Hereinafter, a substrate treating method of the inventive concept will be described with reference to FIG. 7 to FIG. 10. FIG. 7 is a view schematically illustrating the substrate treating method of the inventive concept, and FIG. 8 to FIG. 10 respectively illustrate different embodiments of the substrate treating method of FIG. 7. Hereinafter, the liquid treatment of the substrate W will be described as supplying an organic solvent such as isopropyl alcohol onto the substrate W in the liquid treating chamber 400 of FIG. 1.

Referring to FIG. 7, in the substrate treating method of the inventive concept, the substrate W is transferred and heated after the substrate W is liquid-treated and before the substrate W is dry-treated. In an embodiment, in the substrate treating method of the inventive concept, the organic solvent on the substrate W is heated to a first temperature before the substrate W is brought into the drying chamber 500.

Figure 8:
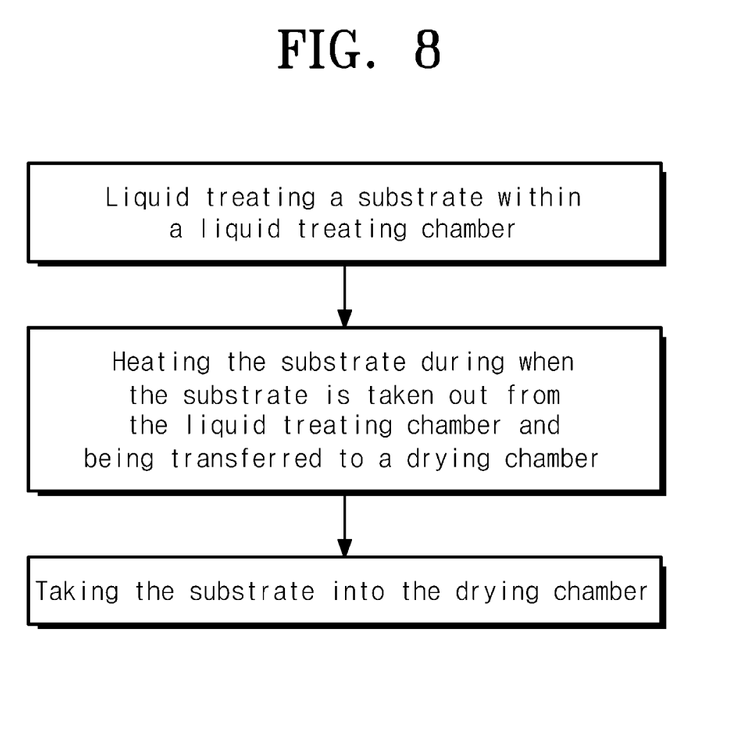

In an embodiment as shown in FIG. 8, the substrate W is liquid-treated by supplying the organic solvent onto the substrate W in the liquid treating chamber 400. Thereafter, the substrate W is taken out from the liquid treating chamber 400. While the transfer robot 320 are transferring the substrate W from the liquid treating chamber 400 to the drying chamber 500, the organic solvent on the substrate W is heated to the first temperature. In an embodiment, the substrate W is heated on the hand 322 while being transferred to the drying chamber 500. In an embodiment, the first temperature is lower than a boiling point of the organic solvent. Once the organic solvent on the substrate W is heated to the first temperature, the substrate W is brought into the drying chamber 500.

Figure 9:
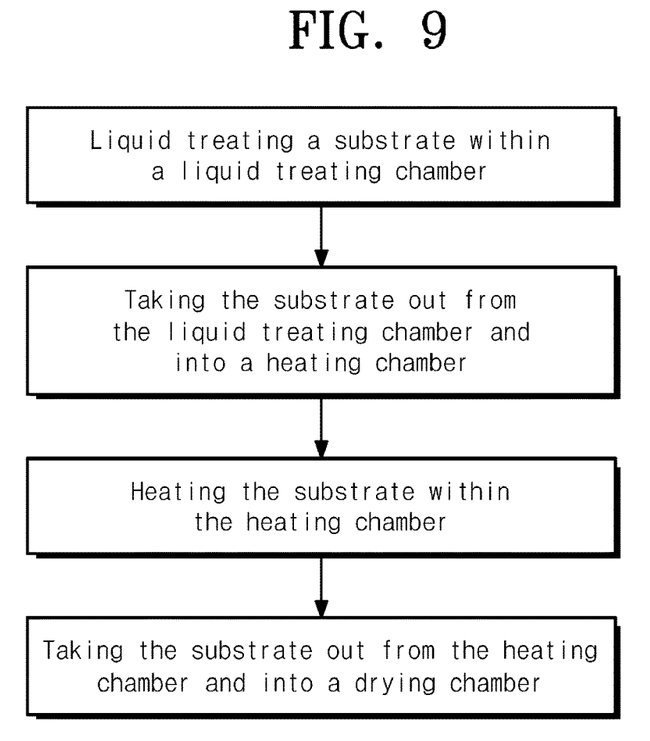

In embodiment as shown in FIG. 9, the substrate W is liquid-treated by supplying the organic solvent onto the substrate W in the liquid treating chamber 400. Thereafter, the substrate W is taken out from the liquid treating chamber 400. The transfer robot 320 takes the substrate W out of the liquid treating chamber 400 and brings the substrate into the heating chamber 700. A high-temperature gas is supplied into the heating chamber 700 to heat the organic solvent on the substrate W to the first temperature. Selectively, the transfer robot 320 takes the substrate W out of the liquid treating chamber 400 and locates the substrate W on the heating plate 610. The substrate W placed on the heating plate 610 is heated by a heater until the organic solvent on the substrate W reaches the first temperature. Once the organic solvent on the substrate W is heated to the first temperature, the substrate W is brought into the drying chamber 500.

Figure 10:
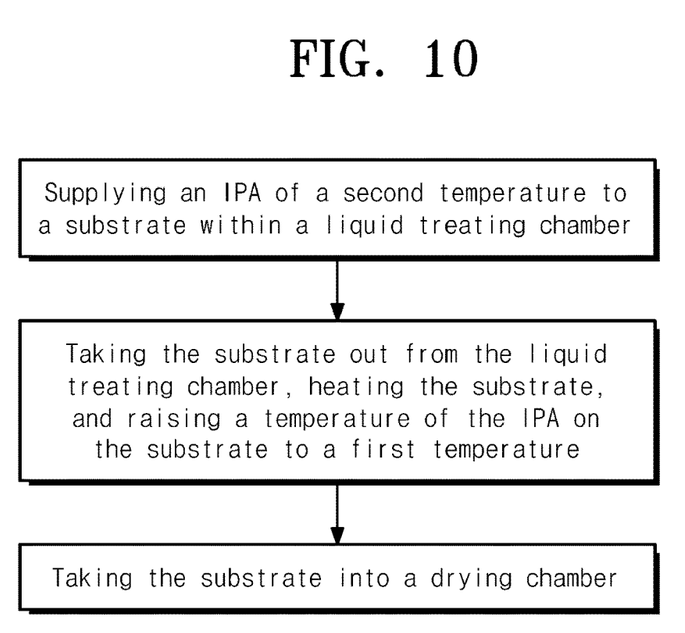

In an embodiment as shown in FIG. 10, an organic solvent having a second temperature is supplied to the substrate W in the liquid treating chamber 400. In an embodiment, the second temperature is higher than a room temperature and lower than the first temperature. An organic solvent is supplied onto the substrate W at a temperature higher than the room temperature so that the organic solvent and the supercritical fluid may be easily mixed in the drying chamber 500. However, when the organic solvent is supplied at an excessively high temperature, evaporation occurs while the organic solvent is being supplied onto the substrate W, and thus the temperature of the organic solvent is not too high than the room temperature. In an embodiment, when the organic solvent is an isopropyl alcohol, the second temperature may be provided at 35 to 45 degrees Celsius.

After liquid treatment of the substrate W, the substrate W is taken out of the liquid treating chamber 400. Thereafter, as described in Embodiment 1 or Embodiment 2, the organic solvent on the substrate W is heated to the first temperature before the substrate W is brought into the drying chamber 500.

In accordance with the inventive concept, there is an advantage in that the organic solvent and supercritical fluid are easily mixed by heating the organic solvent on the substrate W before the substrate W is introduced into the drying chamber 500. Accordingly, there is an advantage in that a time for treating the substrate W in the drying chamber 500 may be shortened, and the organic solvent may be easily removed with the supercritical fluid.

In addition, according to the inventive concept, instead of supplying a high-temperature organic solvent onto the substrate W in the liquid treating chamber 400, the organic solvent taken out from the liquid treating chamber 400 is heated. Accordingly, there is an advantage of preventing evaporation of the organic solvent while supplying the organic solvent onto the substrate W. Accordingly, there is an advantage of preventing a problem of a stain occurring on the substrate W.

In addition, according to the inventive concept, the organic solvent is heated to a boiling point or less, e.g., just below the boiling point. Accordingly, there is an advantage of preventing the organic solvent from evaporating during the process.

The effects of the inventive concept are not limited to the above-mentioned effects, and the unmentioned effects can be clearly understood by those skilled in the art to which the inventive concept pertains from the specification and the accompanying drawings.

Although the embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a liquid treating chamber configured to perform liquid-treating on a substrate therein;
   a drying chamber configured to perform dry-treating on the substrate received from the liquid treating chamber;
   a transfer device configured to transfer the substrate between the liquid treating chamber and the drying chamber; and
   a controller configured to control the liquid treating chamber and the transfer device,
   wherein the transfer device comprises:
   a transfer robot having a hand configured to place the substrate thereon; and
   a heating member configured to heat the substrate,
   wherein the controller controls the transfer device such that the heating member of the transfer device heats a liquid on the substrate to a first temperature before the transfer device transfers the substrate taken out from the liquid treating chamber to the drying chamber,
   wherein the liquid is an organic solvent, and a supercritical fluid is supplied to an inside of the drying chamber,
   wherein the first temperature is lower than a boiling point of the liquid,
   wherein the heating member is provided as a heating plate provided having a heater therein and disposed between the liquid treating chamber and the drying chamber, and
   wherein the heating plate is outside the hand of the transfer robot.

2. The apparatus of claim 1,
   wherein the heating member is provided as a heating chamber between the liquid treating chamber and the drying chamber, and the heating chamber comprises:
   a housing with an opening allowing an entry/exit of the hand;
   a support unit for placing the substrate thereon; and
   a gas supply device for supplying a high temperature gas to an inner space of the housing, wherein a temperature of the high temperature gas is higher than the first temperature.

3. The apparatus of claim 1,
   wherein the controller controls the liquid treating chamber as to supply the liquid at a second temperature to the substrate within the liquid treating chamber, and controls the transfer device for the heating member to heat the liquid on the substrate to the first temperature, the first temperature being higher temperature than the second temperature.

4. The apparatus of claim 3,
   wherein the second temperature is higher temperature than a room temperature.

* * * * *